United States Patent [19]

Kriz et al.

[11] Patent Number: 5,017,807
[45] Date of Patent: May 21, 1991

[54] OUTPUT BUFFER HAVING CAPACITIVE DRIVE SHUNT FOR REDUCED NOISE

[75] Inventors: John C. Kriz, Palmerton; Mean-sea Tsay, Emmaus, both of Pa.

[73] Assignee: AT&T Bell Laboratories, Murray Hill, N.J.

[21] Appl. No.: 549,519

[22] Filed: Jul. 5, 1990

[51] Int. Cl.$^5$ .......................... H03K 17/14; H03K 4/94
[52] U.S. Cl. ................................ 307/443; 307/451; 307/263; 307/310
[58] Field of Search ............... 307/443, 451, 310, 263, 307/475, 448

[56] References Cited

U.S. PATENT DOCUMENTS

| | | | |
|---|---|---|---|
| 4,499,387 | 2/1985 | Konishi | 307/443 |
| 4,797,579 | 1/1989 | Lewis | 307/443 |
| 4,823,029 | 4/1989 | Gabara | 307/443 |
| 4,849,661 | 7/1989 | Bazes | 307/310 |
| 4,859,870 | 8/1989 | Wong et al. | 307/263 |
| 4,894,561 | 1/1990 | Nogami | 307/443 |
| 4,947,061 | 8/1990 | Metz et al. | 307/475 |

Primary Examiner—David Hudspeth
Assistant Examiner—Andrew Sanders
Attorney, Agent, or Firm—James H. Fox

[57] ABSTRACT

An output buffer maintains low noise across a range of process variations, temperatures, and voltages. This is achieved by limiting the drive signal so as to reduce the switching speed of the output buffer as the other variables tend to increase the speed. This is accomplished by limiting the current through the pre-driver stage by controlling the conductance of a shunt transistor connected to a grounded capacitor.

8 Claims, 3 Drawing Sheets

OUTPUT BUFFER HAVING CAPACITIVE DRIVE SHUNT FOR REDUCED NOISE

BACKGROUND OF THE INVENTION

1. Field of the Invention

The present invention relates to an integrated circuit buffer having a capacitive shunt circuit that reduces the noise generated by the buffer.

2. Description of the Prior Art

Integrated circuit output buffers are used to drive a load connected to an external conductor. This load typically includes a relatively large capacitance, and in some cases a significant resistive load also. For this purpose, in designing an output buffer, the output transistors are usually sized to be sufficiently large so as to drive the load at the maximum desired switching speed under worst case conditions. Such worst case conditions typically include a "slow" process, which is a deviation form the nominal fabrication process that yields an integrated circuit that operates at the low end of the acceptable speed range. In addition, operation at high temperature, and low power supply voltage, are also worst case conditions for most designs. However, compensating for these worst case conditions in the design of the buffer may result in unacceptably high switching noise. Such noise may be due to capacitive or inductive coupling from the buffer circuitry to other circuitry on the integrated circuit, or onto external conductors connected thereto. It may also be due to power supply ground bounce due to the current flow as the buffer switches.

Various techniques have recently been developed to control buffer noise. One technique is to control the drive signal to the buffer, so as to reduce the drive level as processing variations, temperature changes, or power supply voltage variations tend to increase the switching speed. In that manner, the buffer may still be designed to operate properly under worst case conditions. Then, under best case conditions, the switching speed, as determined by the rise and fall time of the buffer output voltage, remains relatively constant. Hence, the noise generated by the buffer remains relatively constant. One such technique is described in U.S. Pat. No. 4,823,029 co-assigned with the present invention. However, in some cases other techniques are desirable to control buffer switching noise.

SUMMARY OF THE INVENTION

We have invented an integrated circuit buffer comprising an output stage that receives a drive signal having a magnitude that is controlled at least in part by a shunt circuit comprising a serially connected transistor and capacitor. The conductance of the shunt transistor is controlled so as to maintain the buffer switching speed more constant with respect to variations in factors that may affect it, typically including the integral circuit production process, operating temperature, and operating voltage.

DETAILED DESCRIPTION

Figure 1:
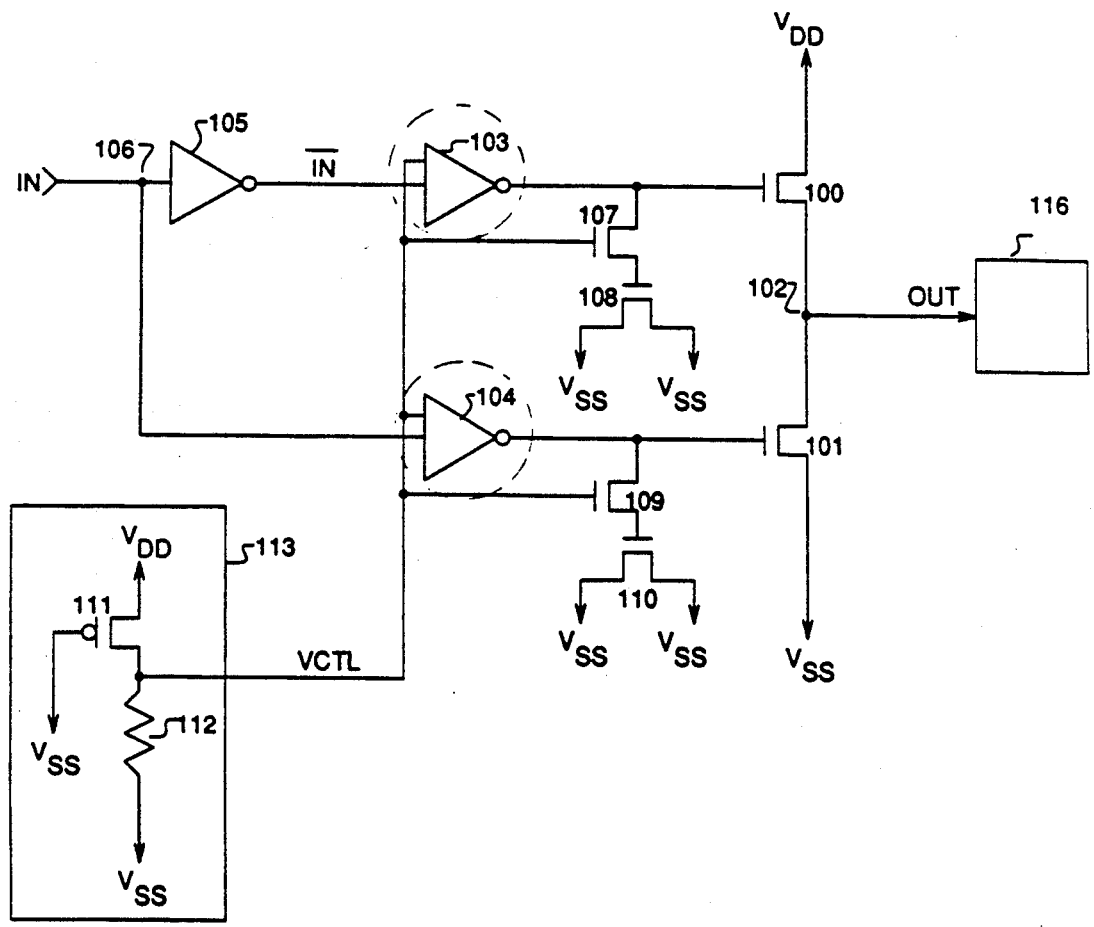
FIG. 1 shows a first exemplary embodiment of the invention suitable for use as a TTL output buffer.
Figure 1:
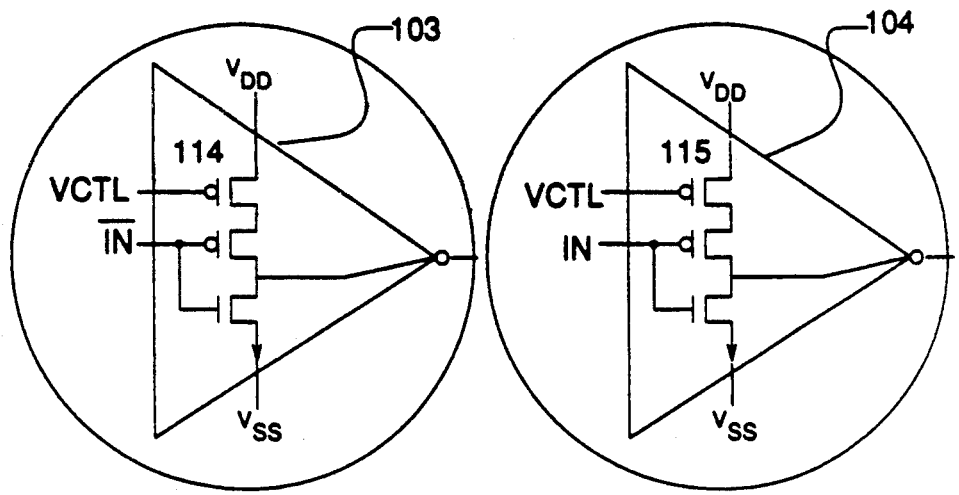

The following detailed description relates to an integrated circuit having a buffer with a capacitive shunt circuit for controlling the drive signal to the buffer output stage, whereby buffer switching noise is reduced. Referring to FIG. 1, an illustrative embodiment of the invention suitable for driving TTL loads is shown. The buffer output stage comprises a n-channel pull-up transistor 100 and a n-channel pull-down transistor 101 having their drains coupled to buffer output node 102. The buffer output node is connected to a bondpad 116 for connection to a package terminal, as by wire bonding or other techniques, whereby the buffer connects to an external load. The external load typically comprises a significant capacitive (AC) component and, in the case of a TTL load, an resistive (DC) component that requires pull-down current from the output buffer. The transistors 100 and 101 are sized accordingly, typically by assuming the worst-case conditions of the integrated circuit manufacturing process variations, operating temperature, and operating voltage. The control electrodes (i.e., gates) of transistors 100 and 101 receive complementary drive signals from current controlled inverters 103 and 104. The input signal to inverter 103 is made complementary with respect to the input signal to inverter 104 by inverter 105, which is connected to data input node 106.

In the inventive technique, the drive signal to the output stage is controlled by shunt circuitry comprising a transistor and a capacitor. Since the drive signal in the embodiment of FIG. 1 comprises complementary components, the pull-up and pull-down transistors are connected to separate shunt circuits. As shown, the gate of pull-up transistor 100 is connected to shunt transistor 107, which is connected to shunt capacitor 108 connected to $V_{SS}$. The pull-down transistor 101 is similarly connected to shunt transistor 109 and shunt capacitor 110. The gates of the shunt transistors 107, 109 are connected to a compensation circuit 113 that generates a control voltage VCTL. As the voltage VCTL increases, the conductance of shunt transistors 107 and 109 increase, thereby shunting more of the drive current to ground ($V_{SS}$) through shunt capacitors 108 and 110, respectively. Therefore, the magnitude of the drive signal at the gates of buffer output transistors 100 and 101 is reduced, which tends to reduce the switching speed of the buffer by increasing the rise and fall times of the output signal at node 102. Conversely, when voltage VCTL decreases, the conductance of shunt transistors 107 and 109 decreases, thereby reducing the amount of the drive signal shunted to ground through the shunt capacitors 108, 110. Therefore, the magnitude of the drive signal at the gates of transistors 100 and 101 tends to increase, which tends to increase the buffer switching speed.

In the illustrative embodiment, the voltage VCTL is generated by transistor 111 and resistor 112, so as to respond to changes as follows:

(1) When the integrated circuit is fabricated by a process that varies from the nominal so as to yield faster than nominal circuit speeds (referred to as a "fast" process), the gain of transistor 111 increases. Therefore, the conductance of transistor 111 increases, which increases voltage VCTL as compared to its nominal value. Conversely, when the integrated circuit is fabricated by a "slow" process, the conductance of transistor 111 decreases, which decreased voltage VCTL as compared to its nominal value.

(2) When the operating voltage $V_{DD}$ increases, the source-to-drain voltage across transistor 111 increases, thereby increasing the channel current through transistor 111. Hence, the current through resistor 112 increases, and voltage VCTL increases, as determined by the ratio of the resistance of transistor 111 to resistor 112. Conversely, when the operating voltage $V_{DD}$ decreases, the voltage VCTL decreases.

(3) When the operating temperature of the integrated circuit increases, the gain of transistor 111 decreases, thereby reducing its conductance. Hence, the voltage VCTL decreases. Conversely, when the operating temperature decreases, the conductance of transistor 111 increases, so that voltage VCTL increases.

As can be seen from the description of the shunt circuitry above, the foregoing changes in VCTL tend to compensate for changes in the switching speed of the buffer. That is, a "fast" process that would otherwise increase buffer switching speed produces a reduction in drive signal that tends to maintain the switching speed more constant that it would be without the shunt circuitry. Similarly, changes in operating voltage and temperature produces compensating changes due to the action of the shunt circuitry. Note that the compensation due to the shunt circuitry may be aided by other compensating circuitry. For example, the inverters 103 and 104 in the illustrative embodiment of FIG. 1 are also shown as controlled by the voltage VCTL. The conductance of transistors 114 and 115 are controlled in a manner that tends to maintain the buffer switching speed more constant. The control of inverters 103 and 104 in this manner is further described in the above-noted U.S. Pat. No. 4,823,029. However, the control of the inverters 103 and 104 is optional insofar as the present invention is concerned.

In a typical implementation of the present invention, the resistor 112 is an off-chip resistor, to obtain a more constant value of resistance with respect to changes in the operating temperature of the integrated circuit. In one present design, a value of 900 ohms is used. However, the control voltage VCTL may be generated by other compensation circuitry than as shown in FIG. 1. For other examples, see the above-noted U.S. Pat. No. 4,823,029, with still others being possible. The shunt capacitors 108 and 110 are shown as MOS field effect devices having the gate electrode serve as one capacitor plate, the semiconductors substrate as the other capacitor plate, and the gate dielectric as the capacitor dielectric. In the illustrative case, a capacitance of about 2 picofarads is suitable for use with circuits implemented in 0.9 micrometer technology, and may be readily obtained. However, other capacitor types are possible, including, for example, deposited doped polysilicon layers separated by an oxide layer. In that case, the serial connection of the shunt transistor and shunt capacitor may be reversed; that is, the shunt capacitor may be connected to the gate of the buffer output transistor, and the shunt resistor may be connected between the shunt capacitor and ground. Note also that instead of connection to ground ($V_{SS}$), the shunt circuitry may be connected to another constant voltage source (e.g., $V_{DD}$), as determined by the characteristics of the devices use in its implementation.

Figure 2:
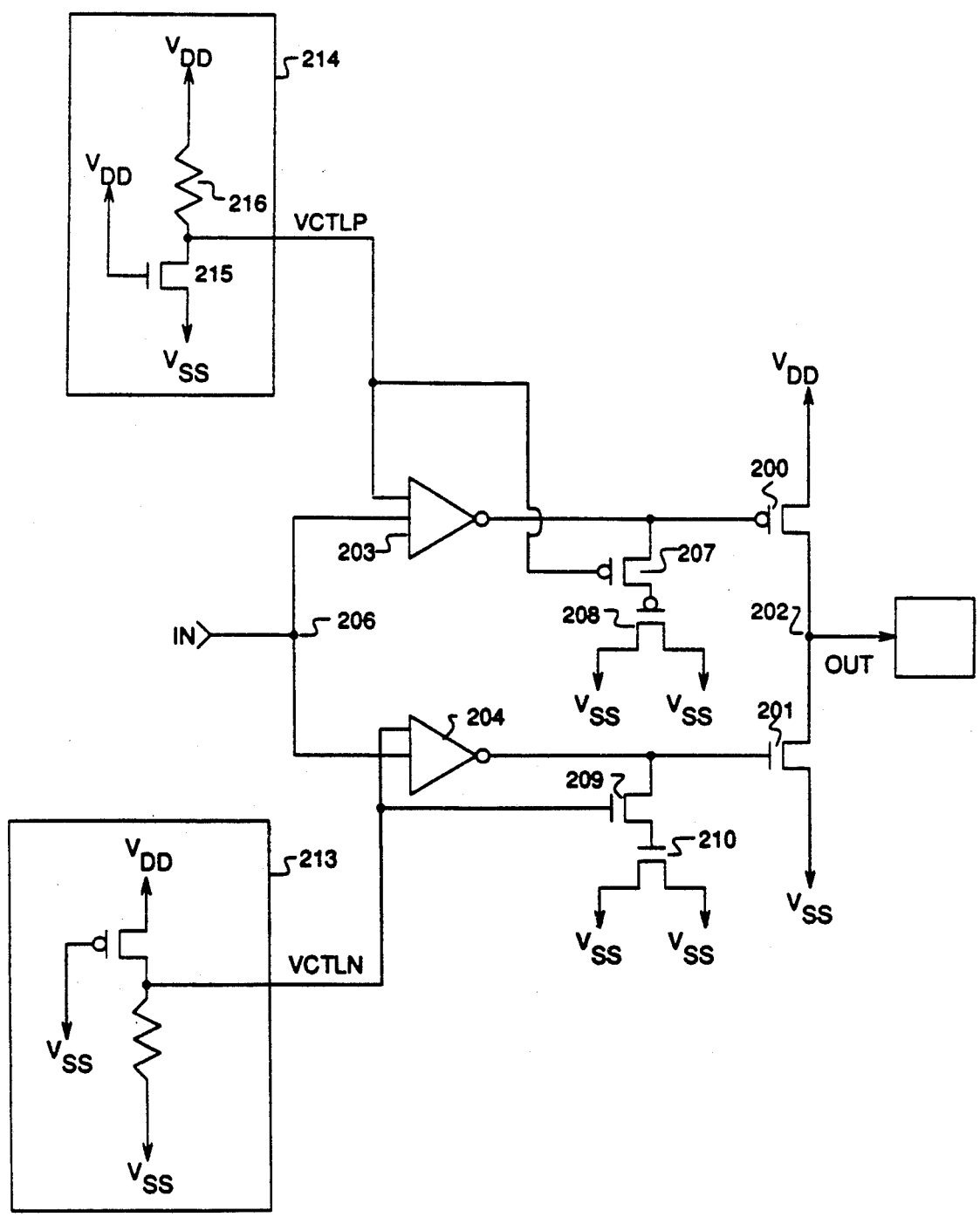
FIG. 2 shows a second exemplary embodiment of the invention suitable for use as a CMOS output buffer.

Referring to FIG. 2, a second illustrative embodiment of the present invention is shown, wherein a CMOS buffer is shown for providing a full $V_{SS}$ to $V_{DD}$ output voltage swing (e.g., 0 to 5 volts). For this purpose, the output stage comprises a p-channel pull-up transistor 200, whereas the pull-down device is n-channel transistor 201. The shunt circuit for the p-channel output device 200 comprises transistor 207 and capacitor 208, which are shown as p-channel devices. The control voltage VCTLP is generated by compensation circuit 214 comprising n-channel transistor 215 and resistor 216. (Alternatively, the shunt transistor may be a n-channel device if desired, in which case the control voltage voltage is generated as in FIG. 1. Similarly, the shunt capacitor may be formed by a n-channel device). The shunt circuit for the n-channel output device 201 comprises transistor 209 and capacitor 210. The control voltage VCTLN is generated by compensation circuit 213, which is comparable to 113 in FIG. 1. If desired, the driver inverters 203 and 204 may optionally be controlled by VCTLP and VCTLN in an analogous manner to that shown for the inverters 103 and 104 in FIG. 1. (In that case, an n-channel transistor may be used to provide the control for inverter 203 in an analogous manner to the p-channel transistor 114 shown in FIG. 1).

Figure 3:
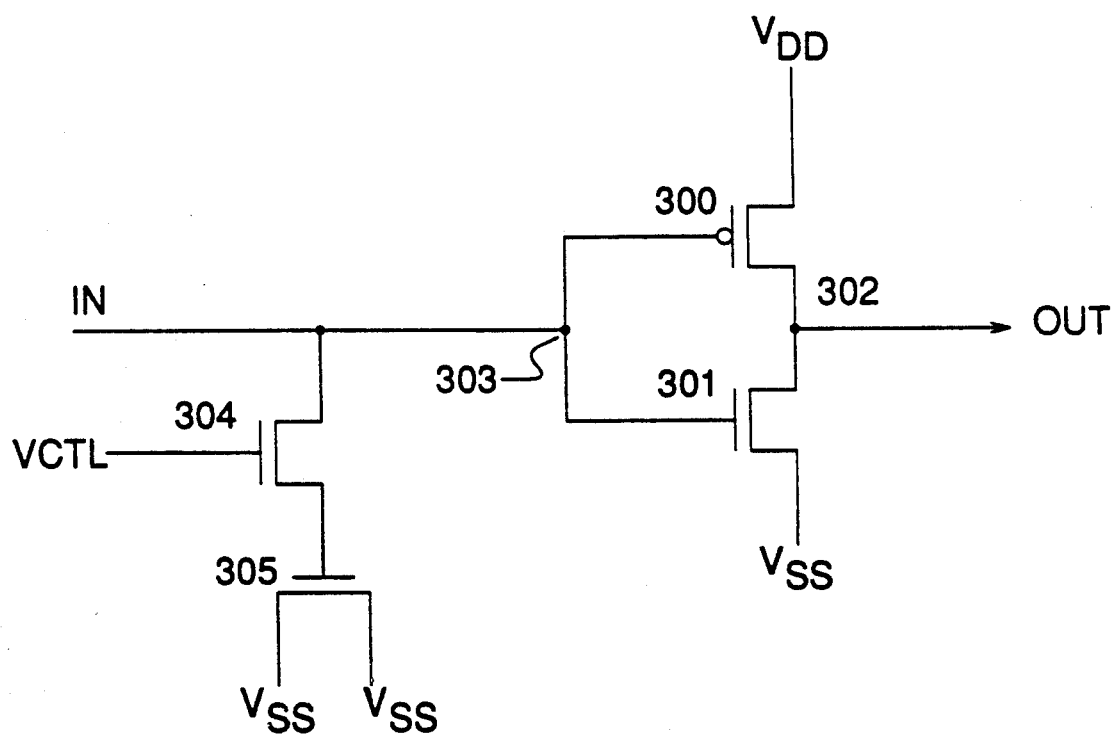
FIG. 3 shows a third exemplary embodiment of the invention suitable for use as a CMOS output buffer.

The foregoing implementations have shown the pull-up and pull-down transistors driven by separate driver stages (103, 104 in FIG. 1 and 203, 204 in FIG. 2). This allows the switching thresholds of the inverter stages to be separately chosen, typically to minimize the simultaneous "on" times of the pull-up and pull-down output transistors, in order to minimize power consumption. Furthermore, the separate drivers allows for readily implementing a tri-state design by additional logic circuitry (not shown) that can turn off both the pull-up and pull-down devices concurrently. The use of two separate shunt circuits for the two output transistors also allows the rise time (due to the pull-up transistor) to be controlled separately from the fall time (due to the pull-down transistor), if desired. However, the present technique may alternatively be used as shown in FIG. 3, wherein the output transistors 300 and 301 have their gates connected to a common input node 303. A single shunt circuit comprising shunt transistor 304 and shunt capacitor 305 provides the desired compensation of buffer speed by slowing down both the rise and fall times of the output voltage at node 302 according to the voltage VCTL, which may be generated as before.

Although output buffers have been discussed above, the present invention may also be used with buffers that drive on-chip loads. For example, clock drivers and other types of circuits that drive long conductors on a chip or wafer (as with wafer scale integration) may benefit from the present invention, and are included within the meaning of "buffer" as used herein. While the foregoing embodiments have been shown in terms of field effect devices, the buffer circuitry may alternatively be implemented with bipolar devices. Still other embodiments and variations of the present invention may be utilized, and all of which that benefit from the inventive teaching are included herein.

We claim:

1. An integrated circuit comprising a buffer including a pull-up transistor for pulling the voltage on a buffer output node to directly shunt a portion of a driving current to one of said pullup and pulldown transistors towards said constant voltage node through said shunt capacitor, wherein toward a first power supply voltage, and a pull-down transistor for pulling the voltage on said node toward a second power supply voltage in response to a buffer input signal, characterized in that said buffer further includes a shunt transistor and a shunt capacitor serially connected between the control electrode of at least one of said pull-up and pull-down transistors and a constant voltage node to directly shunt a portion of a driving current to one of said pull-up and pull-down transistors towards said constant voltage node through said shunt capacitor, wherein the conductance of said shunt transistor is controlled by compensation means to maintain the switching speed of said buffer more constant with respect to variations in at least one of the factors selected from the group consisting of process speed, operating temperature, and operating voltage.

2. The integrated circuit of claim 1 wherein said pull-up transistor is a p-channel field effect transistor and said pull-down transistor is a n-channel field effect transistor.

3. The integrated circuit of claim 1 wherein said pull-up transistor is a n-channel field effect transistor and said pull-down transistor is a n-channel field effect transistor.

4. The integrated circuit of claim 1 wherein a first shunt transistor and a first shunt capacitor are serially connected between the control electrode of said pull-up transistor and a constant voltage node, and wherein a second shunt transistor and a second shunt capacitor are serially connected between the control electrode of said pull-down transistor and a constant voltage node.

5. The integrated circuit of claim 1 wherein said buffer is an output buffer, with said buffer output node being connected to a bondpad.

6. The integrated circuit of claim 1 wherein said buffer is an on-chip driver, wherein said buffer output node is connected to a load on said integrated circuit.

7. The integrated circuit of claim 1 further comprising an inverter having a p-channel inverter pull-up transistor and a n-channel inverter pull-down transistor having their drains connected to the control electrode of said at least one of said pull-up and pull-down transistors, and having their sources connected to power supply voltages.

8. The integrated circuit of claim 7 further comprising a control transistor that controls the current flow through said p-channel inverter pull-up transistor and said n-channel inverter pull-down transistor, wherein the conductance of said control transistor is controlled by compensation means to maintain the switching speed of said buffer more constant with respect to variations in at least one of the factors selected from the group consisting of process speed, operating temperature, and operating voltage.

* * * * *